US009497823B2

(12) United States Patent
McRae

(10) Patent No.: US 9,497,823 B2
(45) Date of Patent: *Nov. 15, 2016

(54) LIGHT BULB AND FLORESCENT TUBE REPLACEMENT USING FIPEL PANELS

(71) Applicant: Vizio Inc, Irvine, CA (US)

(72) Inventor: Matthew McRae, Laguna Niguel, CA (US)

(73) Assignee: Vizio, Inc, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/571,599

(22) Filed: Dec. 16, 2014

(65) Prior Publication Data

US 2015/0097491 A1 Apr. 9, 2015

Related U.S. Application Data

(63) Continuation of application No. 13/887,294, filed on May 4, 2013, now Pat. No. 8,912,733.

(51) Int. Cl.

| | |
|---|---|
| ***G05F 1/00*** | (2006.01) |
| ***H05B 37/02*** | (2006.01) |
| ***H05B 39/04*** | (2006.01) |
| ***H05B 41/36*** | (2006.01) |
| ***H05B 33/12*** | (2006.01) |
| ***F21K 99/00*** | (2016.01) |
| ***H05B 33/08*** | (2006.01) |
| ***H05B 33/26*** | (2006.01) |
| ***H05B 33/28*** | (2006.01) |
| *F21V 3/00* | (2015.01) |

(Continued)

(52) U.S. Cl.

CPC ................. *H05B 33/12* (2013.01); *F21K 9/10* (2013.01); *F21K 9/135* (2013.01); *F21K 99/00* (2013.01); *H05B 33/0857* (2013.01); *H05B 33/26* (2013.01); *H05B 33/28* (2013.01); *F21V 3/00* (2013.01); *F21Y 2111/00* (2013.01); *H01L 51/50* (2013.01)

(58) Field of Classification Search

None

See application file for complete search history.

(56) References Cited

U.S. PATENT DOCUMENTS 6,371,637 B1 4/2002 Atchinson et al.
8,912,733 B2 * 12/2014 McRae ......................... 315/291

(Continued)

FOREIGN PATENT DOCUMENTS

EP 1484547 8/2006
EP 2535640 12/2012

OTHER PUBLICATIONS

Chen et al., "Effect of Multi-Walled Carbon Nanotubes on Electron Injection and Charge Generation in AC Field-Induced Polymer Electroluminescence.", Organic Electronics 14 (2013).

(Continued)

*Primary Examiner* — Anh Tran

(74) *Attorney, Agent, or Firm* — Law Office of Scott C Harris, Inc

(57) ABSTRACT

A lighting device formed of a FIPEL panel driven by electrical connection. For example, a frequency generator can create a frequency that creates a light output having any frequency in the spectrum. The light emitting panel can be flexible, and can be coded along a curved surface, such as the inner surface of a light bulb.

25 Claims, 9 Drawing Sheets

(51) Int. Cl.
*F21Y 111/00* (2016.01)
*H01L 51/50* (2006.01)

(56) References Cited

U.S. PATENT DOCUMENTS

| | | | |
|---|---|---|---|
| 2006/0125410 | A1 | 6/2006 | Duggal et al. |
| 2012/0007486 | A1 | 1/2012 | Fulop et al. |
| 2012/0081880 | A1 | 4/2012 | Narendran et al. |
| 2012/0218774 | A1 | 8/2012 | Livingston |
| 2012/0236569 | A1 | 9/2012 | Chang et al. |
| 2012/0306341 | A1 | 12/2012 | Guo |
| 2013/0003361 | A1 | 1/2013 | Igaki et al. |

OTHER PUBLICATIONS http://hyperphysics.phy-astr.gsu.edu/%E2%80%8Chbase/vision/cie.html.

* cited by examiner

LIGHT BULB AND FLORESCENT TUBE REPLACEMENT USING FIPEL PANELS

This application is a continuation application of U.S. Ser. No. 13/887,294 filed May 4, 2013, now U.S. Pat. No. 8,912,733 issued Dec. 16, 2014, which the disclosures of this parent application is hereby incorporated by reference, in its entirety.

BACKGROUND

From their first introduction, Incandescent light bulbs have been the standard lighting source since the early 20th century. Incremental improvements to the incandescent light bulbs improved their efficiency for light output vs power resulting in a top efficiency of about 17% for a 100 watt light bulb.

The next advance in lighting came with the introduction of the Compact Fluorescent Light bulb more commonly referred to as the CFL. A CFL is a fluorescent lamp designed to replace an incandescent lamp; some types fit into light fixtures formerly used for incandescent lamps. The lamps use a tube which is curved or folded to fit into the space of an incandescent bulb, and a compact electronic ballast in the base of the lamp. Compared to general-service incandescent lamps giving the same amount of visible light, CFLs use one-fifth to one-third the electric power, and last eight to fifteen times longer.

The next evolution of the light bulb is the LED light bulb or lamp. This is a solid-state lamp that uses light-emitting diodes (LEDs) as the source of light. LED lamps offer long service life and high energy efficiency, but initial costs are higher than those of fluorescent and incandescent lamps. Chemical decomposition of LED chips reduces luminous flux over life cycle as with conventional lamps.

Commercial LED lighting products use semiconductor light-emitting diodes. LED lamps can be made interchangeable with other types of lamps. Assemblies of high power light-emitting diodes can be used to replace incandescent or fluorescent lamps. Some LED lamps are made with bases directly interchangeable with those of incandescent bulbs. Since the luminous efficacy (amount of visible light produced per unit of electrical power input) varies widely between LED and incandescent lamps, lamps are usefully marked with their lumen output to allow comparison with other types of lamps. LED lamps are sometimes marked to show the watt rating of an incandescent lamp with approximately the same lumen output, for consumer reference in purchasing a lamp that will provide a similar level of illumination. Efficiency of LED devices continues to improve, with some chips able to emit more than 100 lumens per watt.

SUMMARY

What is needed is a device that has the same or better efficiency of a LED light bulb but less expensive to produce. Another aspect can be one that gives the consumer more control over the color and brightness of the light.

The embodiments describe an apparatus, method and system for replacing incandescent, CFL and fluorescent lighting devices with FIPEL panel technology.

One aspect uses a light emitting material that extends across a surface, where the surface is a non-flat surface. In another aspect the surface that emits the light for the light producing element is a curved surface, and the light emission is over the curved surface.

Another aspect uses multiple layers of light emitting material where the multiple layers each emit light and hence more layers can be stacked to create multiple light emissions.

DETAILED DESCRIPTION

Figure 5:
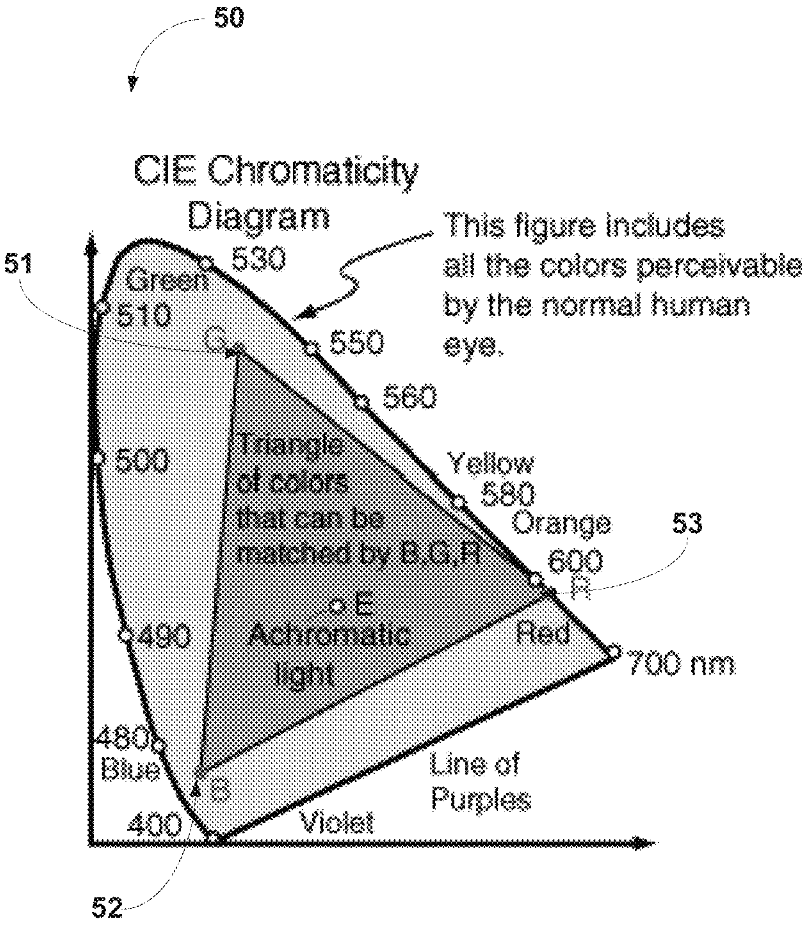
FIG. 5 is a depiction of the CIE color index with a triangle bounding the colors that are specified by the NTSC standard for television.

Embodiments are described herein that use a lighting technology called Field Induced Polymer ElectroLumuinescence, referred to as FIPEL lighting. FIG. 5 is a replication of the CIE color index chart. Note that 51, 52 and 53 are points to the vertices Green (51), Blue (52) and Red (53). The three X,Y coordinates form a triangle that represents the perimeter of a color space used for NTSC defined color.

FIPEL panels have the distinguishing feature of being able to emit colored light from any point on the CIE index bound by the triangle shown in FIG. 5. Embodiments use of this feature of FIPEL light panels by selecting the color temperature of 3,000 Kelvin.

Figure 1:
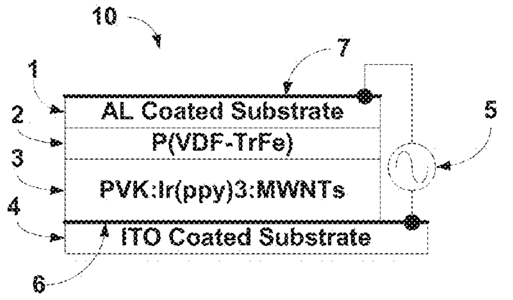
FIG. 1 is a depiction of an asymmetrical (single dielectric layer) FIPEL device that emits light from one surface.
Figure 2:
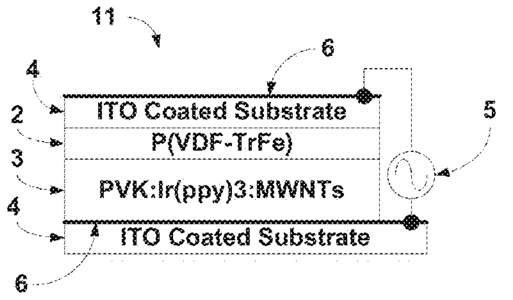
FIG. 2 is a depiction of an asymmetrical (single dielectric layer) FIPEL device that emits light from two surfaces.

To appreciate the simplicity of FIPEL devices reference FIGS. 1 and 2.

FIGS. 1 and 2 illustrate single dielectric FIPEL devices. The basic construction of these FIPEL devices is discussed in the following.

Lab quality FIPEL devices are generally fabricated on glass or suitable plastic substrates with various coatings such as aluminum and Indium tin oxide (ITO). ITO is a widely used transparent conducting oxide because of its two chief properties, it is electrical conductive and optical transparent, as well as the ease with which it can be deposited as a thin film onto substrates. Because of this, ITO is used for conducting traces on the substrates of most LCD display screens. As with all transparent conducting films, a compromise must be made between conductivity and transparency, since increasing the thickness increases the concentration of charge carriers which in turn increases the material's conductivity, but decreases its transparency. The ITO coating used for the lab devices discussed here is approximately 100 nm in thickness. In FIG. 1, emissive side substrate 4 is coated with ITO coating 6 residing against PVK layer 3. In FIG. 2, ITO coating 6 is on both substrates as shown.

Figure 3:
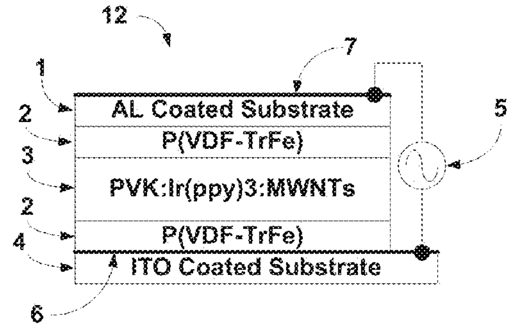
FIG. 3 is a depiction of a symmetrical (two dielectric layers) FIPEL device that emits light from one surface.
Figure 4:
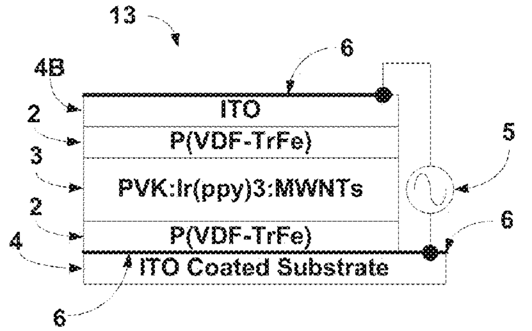
FIG. 4 is a depiction of a symmetrical (two dielectric layers) FIPEL device that emits light from two surfaces.

Substrate 1 in FIGS. 1 and 3, is coated with aluminum (AL) coating 7. The resulting thickness of the AL deposition is sufficient to be optically opaque and reflective. To ensure that any light from emissive layer 3 that travels toward substrate 1 is reflected and directed back through emissive substrate 4 with ITO coating 6 for devices illustrated in FIG. 1. If it is desired that light be emitted through both substrates, a substrate 4 with an ITO coating 6 will be substituted for substrate 1 with AL coating 5 as shown in FIG. 2.

The differences between the two similar substrates is how ITO coating 6 is positioned. In FIG. 1, emissive ITO coating 6 is positioned such that ITO coating 6 on substrate 4 is physically in contact with PVK layer 3. In FIG. 2, substrate 1 with Al coating 7 (FIG. 1) is replaced with substrate 4 with ITO coating 6 not in physical contact with the P(VDF-TrFe) (dielectric layer) layer 2. This allows light to be emitted from both the top and bottom surfaces of the FIPEL device.

Dielectric layer 2 in all cases is composed of a copolymer of P(VDF-TrFE) (51/49%). The dielectric layer is generally spin coated against the non-AL coated 7 side of substrate 1 or non-ITO coated 6 of substrate 4 of the top layer (insulated side). In all cases the dielectric layer is approximately 1,200 nm thick.

Emissive layer 3 is composed of a mix polymer base of poly(N-vinylcarbazole):fac-tris(2-phenylpyri-dine)iridium (III) [PVK:Ir(ppy)3]with Medium Walled Nano Tubes (MWNT). The emissive layer coating is laid onto the dielectric layer to a depth of approximately 200 nm. For the lab devices with the greatest light output the concentration of MWNTs to the polymer mix is approximately 0.04% by weight.

When an alternating current is applied across the devices shown in FIGS. 1 and 2 (asymmetrical devices containing 1 dielectric layer) the emissive layer emits light at specific wavelengths depending on the frequency of the alternating current. The alternating current is applied across the conductive side of the top substrate 1 (Al coating 7) or substrate 4 and the conductive side (ITO coating 6) of bottom substrate 4. Light emission comes from the injection of electrons and holes into the emissive layer. Holes follow the PVK paths in the mixed emissive polymer and electrons follow the MWNTs paths.

Carriers within the emissive layer then recombine to form excitons, which are a bound state of an electron and hole that are attracted to each other by the electrostatic force or field in the PVK host polymer, and are subsequently transferred to the Ir(ppy)3 guest, leading to the light emission.

The frequency of the alternating current applied across the substrates of the FIPEL panel can also determine the color of light emitted by the panel. Any index on the CIE can be duplicated by selecting the frequency of the alternating current. Signal generator 5 may be of a fixed frequency which is set by electronic components.

Figure 6:
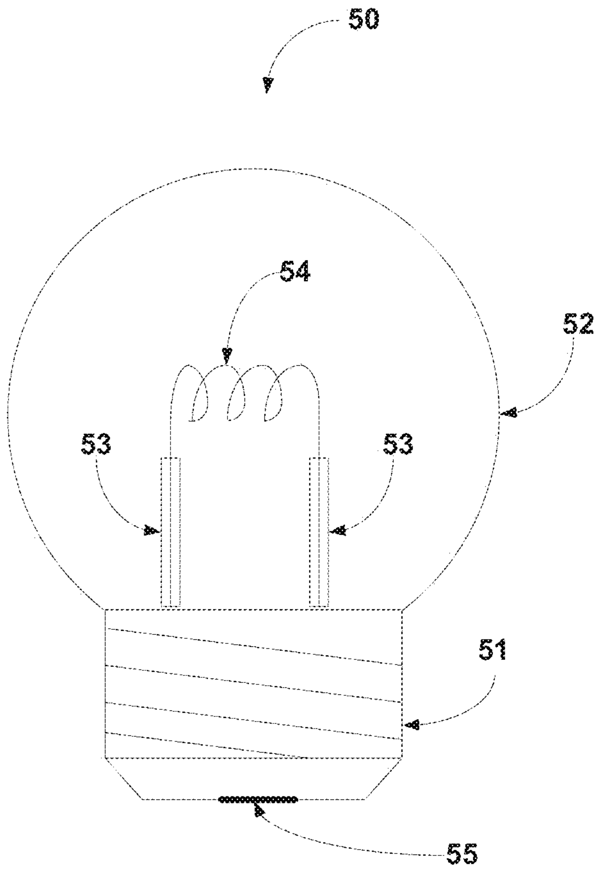
FIG. 6 is a schematic depiction of a standard incandescent light bulb.

Now referencing prior art FIG. 6 where 50 depicts a current state of the art incandescent light bulb. In this depiction, 51 is the base of the light bulb and 55 is the second conductor for carrying power to filament 54. 52 is the glass envelope that contains filament assembly 53 and 54. Glass envelope 52 is generally a low order vacuum or some inert gas. In this depiction, 53 are insulated supports which hold filament 54. Filament 54 also runs down the center of each of the insulators 53. One end of filament 54 is physically connected to base 51 and the other end of filament 54 is connected to center conductor 55. When power is applied across base 51 and center conductor 55 it flows through filament 54. When filament 54 is conducting power or current the internal resistance of filament 54 will cause filament 54 to become heated. Generally, light given off from the filaments of incandescent light bulbs is a warm yellow light at a temperature of 3,000 Kelvin.

Figure 7:
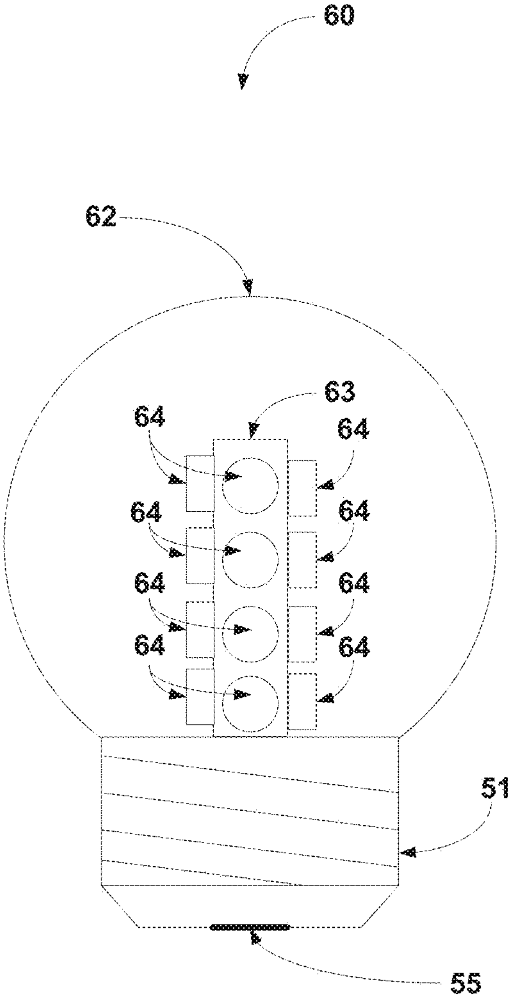
FIG. 7 is schematic depiction of a LED light bulb.

Now referencing prior art FIG. 7 where 60 depicts one type of LED light bulb. LED light bulbs will emit substantially more light per watt of power consumed because of the higher efficiency of LEDs over incandescent light bulbs. In this depiction, 51 and 55 comprise the base of LED light bulb 60. 63 is a support structure for mounting LEDs 64. These LEDs may emit white or blue light or may emit ultraviolet (UV). If the LED emits UV the surface of the UV LED may be coated with a yellow phosphorous material which emits white light when stimulated by UV. 62 is the envelope containing assembly 63. In some embodiments, envelope 62 may have vent holes to facilitate the shedding of heat from the LEDs. Structure 63 may contain electronic components. If the power to LED light bulb 60 is an alternating current that is conducted into LED light bulb 60 via base 51 and center conductor 55, structure 63 will generally contain a rectifier and some other control electronics to manage current for LEDs 64

Figure 8:
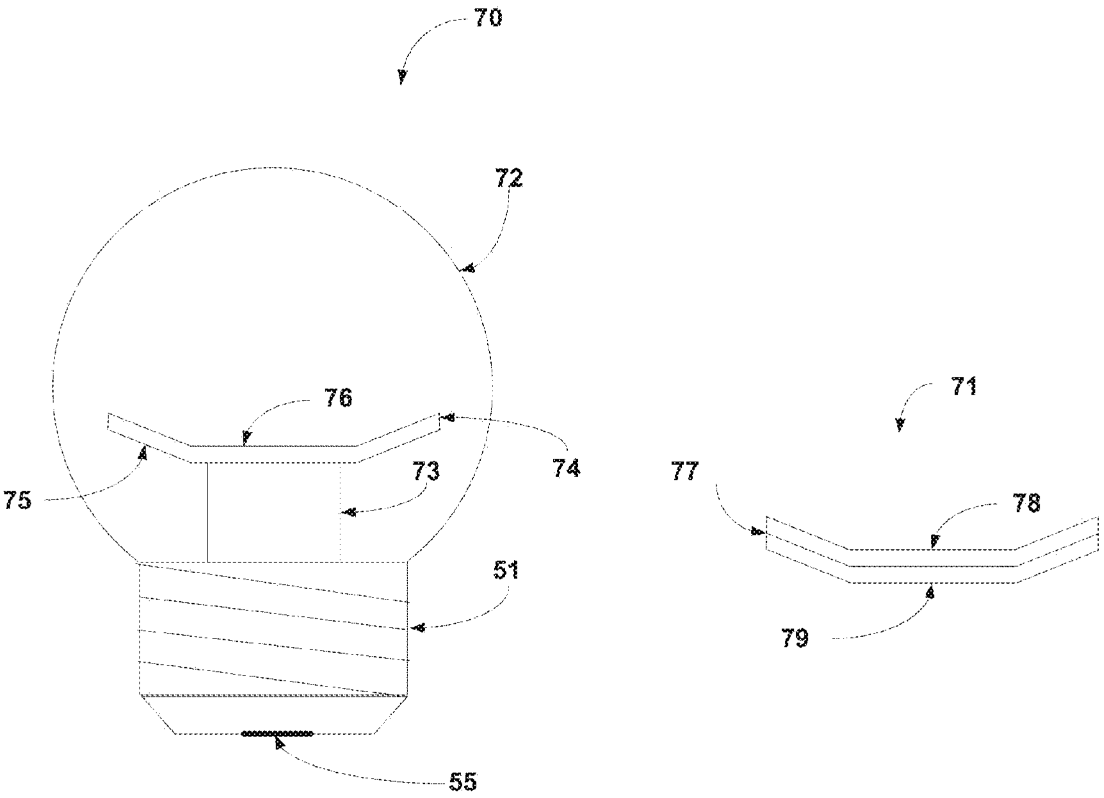
FIG. 8 is a schematic depiction of a FIPEL light bulb where the filament of a standard incandescent light bulb is replaced with a FIPEL light emitting panel.

Now referencing FIG. 8 where 70 depicts one embodiment of a FIPEL based light bulb. In this depiction, base 51 and center conductor 55 facilitate bringing power to the device electronics and FIPEL panel 74. In this depiction 75 represents aluminum coated substrate 1/7 (reflective substrate FIG. 1) and ITO coating substrate 76 represents ITO coated substrate 4/6 (shown in FIG. 1).

In this depiction structure 73 contains signal generator 5 (FIG. 1) and power conversion circuitry to rectify current received through base 51 and center conductor 55. In this embodiment, FIPEL panel 74 is a single panel device as depicted in FIG. 1. Fipel panel 74 is along a bent path, e.g., not a straight line. In another embodiment, panel 74 is curved.

In an embodiment, the signal generator creates a fixed frequency. However, the same structure can be used to form different bulbs with different color temperature outputs, by changing the frequency of the signal generator 5*a*/5B.

Figure 12:
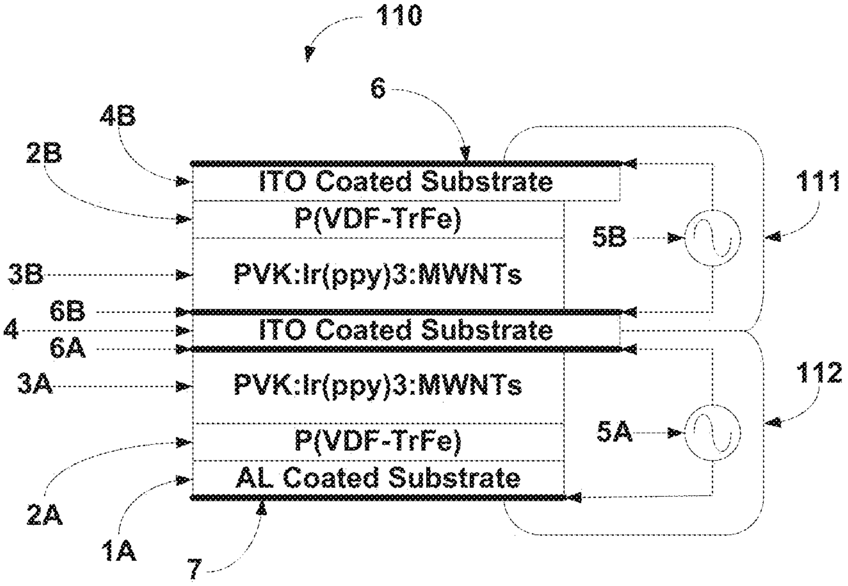
FIG. 12 is a schematic depiction of multiple FIPEL devices stacked on top of another to increase the amount of light emitted by a multiple FIPEL device that emits light in a single direction.

Now referencing FIG. 12 where 110 depicts two slightly different FIPEL devices 111 and 112. FIPEL device 112 is composed of aluminum coated substrate layer 1A/7 which conducts current from signal generator 5A. The next layer up is dielectric layer 2A followed by emissive layer 3A and ITO coated substrate layer 4A/6A which completes the current path from signal generator 5A. Emissive layer 3A will emit light from both surfaces. Light emitted downward will be reflected back by aluminum coated substrate layer 1A/7.

FIPEL device 111 is composed of ITO coated substrate layer 4/6B which conducts current from signal generator 5B to ITO coating 6B and on to emissive layer 3B. Above emissive layer 3B is dielectric layer 2B followed by ITO coated substrate 4B/6 which completes the current path from signal generator 5B.

Emissive layers 3A and 3B both emit light from both of their surfaces. Light emitted downward from both emissive layers 3A and 3B will be reflected back up by reflective layer 1A/7 and out of the stacked device through ITO coated substrate 4B/6.

The stacked FIPEL device as depicted in 110 allows for multiple FIPEL devices to be stacked to increase the amount of light output for every stacked device added.

Figure 9A:
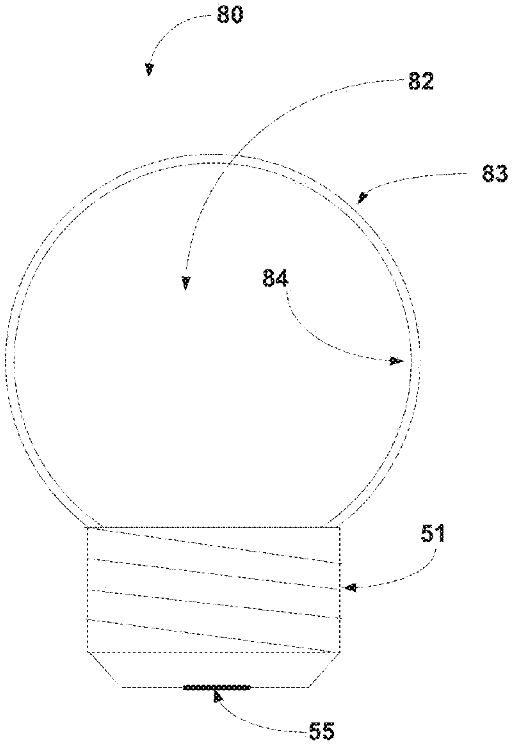
FIGS. 9A and 9B are schematic depictions of a FIPEL light bulb where the shell of stand incandescent light bulb is replaced with a FIPEL light emitting panel.

Now referencing FIG. 9A where 80 is a depiction of a FIPEL light bulb that appears as a normal frosted light bulb. In this depiction base 51 and center conductor 55 facilitate bringing power to the electronics and FIPEL panel which forms the inner surface of the frosted light bulb. In this depiction 82 is the light bulb shaped FIPEL device where ITO coated substrate 4/6 (FIG. 1) forms the outer surface of FIPEL device 84 and AL coated substrate 1/7 (FIG. 1) forms the inner surface of FIPEL device 84. The FIPEL light bulb emits light over the complete surface of the bulb.

Figure 9B:
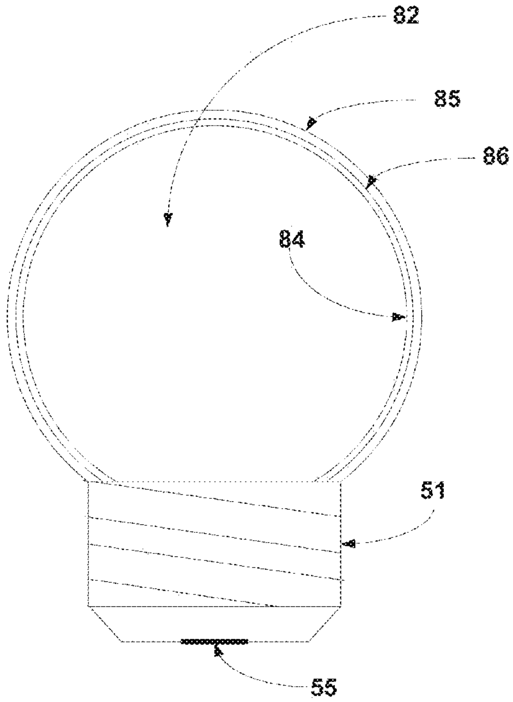

In a slightly different embodiment shown in FIG. 9B, FIPEL light bulb 82 contains a stacked FIPEL device as shown in FIG. 12. In FIG. 9B 1A/7 forms the inner surface of the FIPEL light bulb which is aluminum coated substrate as depicted in FIG. 12 reference 112. 1A/7 reflects light from emissive layers 3A and 3B through ITO coated substrate 4B/6 as shown in FIG. 12. The ability of FIPEL devices to be stacked results in more light output per square inch of outer surface for these stacked FIPEL devices.

Figure 10A:
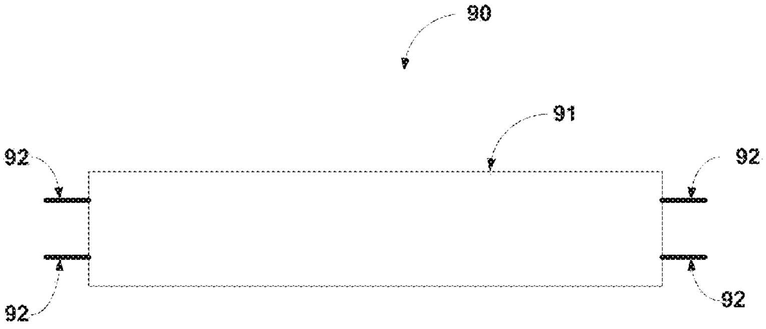
FIGS. 10A and 10B are schematic depictions of a FIPEL light tube intended to replace a fluorescent light tube.
Figure 10B:
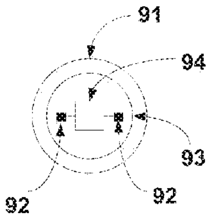

Now referencing FIG. 10A where 90 is a depiction of a FIPEL device formed as a fluorescent tube. In this depiction, 91 depicts the body of the FIPEL tube and 92 depicts the prongs normally found on either end of a fluorescent tube. In this depiction, prongs 92 conduct current from the structure supporting the FIPEL tube. In this depiction, FIG. 10B further depicts electronics module 94 which contains components to power a signal generator that provides an alternating high frequency current to FIPEL device 91.

Figure 11A:
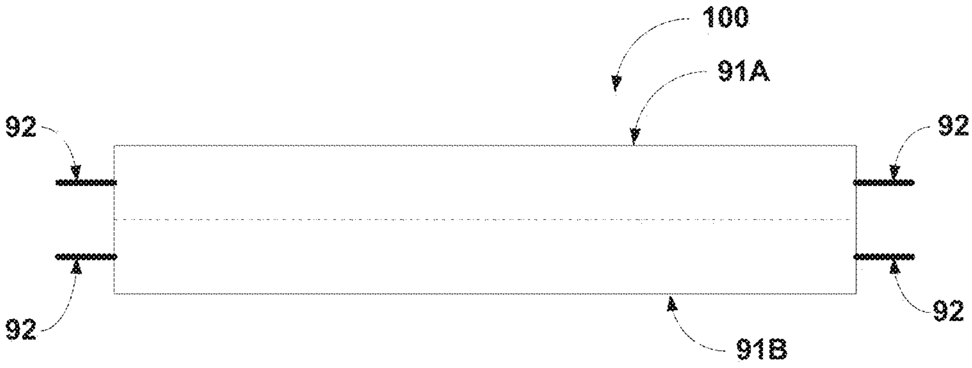
FIGS. 11A, 11B and 11C are schematic depictions of a FIPEL light tube intended to replace a fluorescent light tube where the FIPEL tube directs all light in a more constrained direction.
Figure 11B:
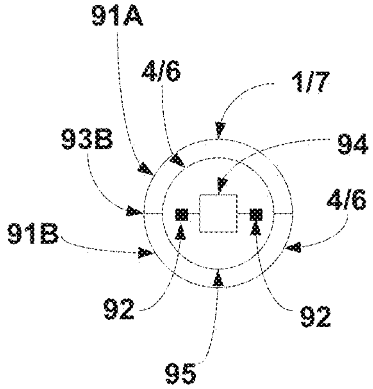

In another embodiment shown in FIG. 11A, the FIPEL tube depicted in FIG. 10 is divided into a top section 91A and a bottom section 91B. In this depiction the interior end view FIG. 11B depicts the two different FIPEL devices shown at dividing line 93B. Top section 91A is formed of a FIPEL device where the outer surface of the FIPEL device is aluminum coated substrate 1/7 (FIG. 1) and the inner surface is ITO coated substrate 4/6 (FIG. 1). This FIPEL device emits light in one direction which is to the interior of FIPEL tube 100. The bottom section 91B (FIG. 11B) contains an outer surface of ITO coated substrate 4/6 (FIG. 2) and an inner surface composed of ITO coated substrate 4/6 (FIG. 2). The bottom section emits light toward the top section which reflects light back through the bottom section. The bottom section also emits light from emissive layer 3 directly out of the outer surface of ITO coated substrate 4/6. This configuration allows all of the light emitted by both the top section 91A and bottom section 91B of FIG. 11A in one direction.

Figure 11C:
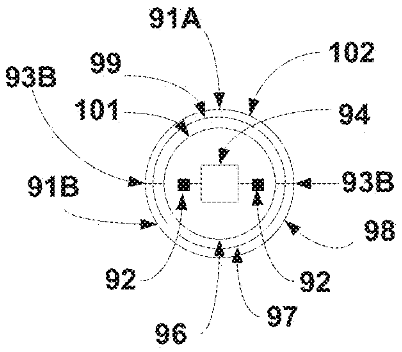

In a slightly different embodiment shown in FIG. 11C, FIPEL tube 91A and 91B are comprised of stacked FIPEL devices which results in more emitted light per unit surface area. In FIG. 11C, the top section of FIPEL tube 100 is composed of a stacked FIPEL device as shown in FIG. 12 112. In this depiction the outer surface of the top section is aluminum coated substrate 1A/7 as depicted in FIG. 12. The inner surface of FIPEL tube 91A is ITO coated substrate 4B/6. The top section directs all of its emitted light to the interior of FIPEL tube 100.

The bottom section 91B is also composed of a stacked FIPEL device where the inner surface of 91B is composed of ITO coated substrate 4B/6 and the outer surface of 91B is composed of ITO coated substrate 4/6 (FIG. 2) which replaces reflective layer 1A/7 of FIG. 12. This allows light emitted by emissive layers 3A and 3B (FIG. 12 112 to emit light out of the bottom of bottom section and into the center of FIPEL tube 100. Light emitted into the center of FIPEL tube 100 is reflected by aluminum coated substrate 1A7 which is the outer surface of the top section of FIPEL tube 100. The ability of FIPEL devices to be stacked results in more light output per square inch of outer surface are of stacked FIPEL devices.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended for cover any modification or alternatives which might be predictable to a person having ordinary skill in the art. For example, other shapes of "bulbs" can be used. The embodiments show only a few different kind of electrical connections, e.g., the light bulb screw connection and pin connections, but other connections can be used. Also, the above illustrates stacking only two of the FIPEL substrates, however applicant believes that more substrates can be stacked including three, four, five or any number so long as the number of FIPEL devices that are stacked emit light from both services, with a final FIPEL device having a reflective surface.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, display port, or any other form. This may include laptop or desktop computers, and may also include portable computers, including cell phones, tablets such as the IPAD™, and all other kinds of computers and computing platforms.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A lighting device, comprising a housing, having at least one surface through which light is output;

an electrical connection; and a light emitting substance connected to said electrical connection, said light emitting substance extending along a curved path and outputting light of a wavelength dependent on a frequency of a driving signal received over said electrical connection, said light emitting substance emitting light in multiple directions.

2. The device as in claim 1, wherein said light emitting substance includes a transparent conductive substrate, connected to receive said electrical connection, and another substrate, also connected to receive said electrical connection, and light-emitting polymer layers, sandwiched between said transparent conductive substrate and said another substrate.

3. The device as in claim 2, wherein said light-emitting polymer layers emit light of a wavelength that is dependent on a frequency of said electrical connection.

4. The device as in claim 3, further comprising a signal generator, to output a signal having a frequency to said electrical connection.

5. The device as in claim 2, wherein said another substrate is also transparent.

6. The device as in claim 2, wherein said another substrate is reflective, and reflects light emitted by said light emitting substance back toward said transparent substrate.

7. The device as in claim 1, wherein said light emitting substance includes a first stack of materials including a substrate, a light-emitting polymer layer connected to said substrate, and a second substrate; and a second stack of materials, including at least one light-emitting polymer connected to said second substrate, and a third substrate, where both said first stack of materials and said second stack of materials emit light.

8. The device as in claim 7, where said third substrate is reflective and light emitted by said second stack passes through said first stack and said substrate of said first stack.

9. The device as in claim 1, wherein said light emitting substance is attached to said housing over a curved surface of said housing.

10. The lighting device as in claim 7, further comprising a second signal generator producing an output that drives said second stack.

11. The light emitting device as in claim 1, wherein said housing is spherical, and said light emitting substance is coated on a complete area of said spherical housing.

12. The light emitting device as in claim 3, wherein a color of the emitted light is any point on a CIE index, selected by selecting said frequency.

13. A lighting device, comprising a housing, having at least one surface through which light is output, at least part of said surface being curved;

an electrical connection; and a light emitting stack connected to said electrical connection, said light emitting stack including a transparent conductive substrate facing toward said housing, connected to receive said electrical connection, and another substrate, also connected to receive said electrical connection, and light-emitting polymer layers, sandwiched between said transparent conductive substrate and said another substrate, said light emitting stack outputting light of a wavelength dependent on a frequency of a driving signal received over said electrical connection, said light emitting substance emitting light in multiple directions.

14. The device as in claim 13, further comprising a signal generator, to output a signal having a frequency to said electrical connection.

15. The device as in claim 13, wherein said another substrate is also transparent.

16. The device as in claim 13, wherein said another substrate is reflective, and reflects light emitted by said light emitting substance back toward said transparent substrate.

17. The device as in claim 13, wherein said light emitting substance includes a second stack of materials, including at least one light-emitting polymer connected to said another substrate, and a third substrate, where both said first stack of materials and said second stack of materials emit light.

18. The device as in claim 17, where said third substrate is reflective and said another substrate is transparent and light emitted by said second stack passes through said light emitting stack and said transparent conductive substrate.

19. The device as in claim 13, wherein said light emitting substance is attached to said housing over a curved surface of said housing.

20. The lighting device as in claim 17, further comprising a second signal generator producing an output that drives said second stack.

21. A lighting device, comprising a housing, having at least one surface through which light is output;

an electrical connection; and a light emitting substance connected to said electrical connection, said light emitting substance formed of :

a first stack of materials having a transparent conductive substrate, connected to receive said electrical connection, and a second transparent substrate, also connected to receive said electrical connection, and light-emitting polymer layers, sandwiched between said transparent conductive substrate and said second substrate, and a second stack of materials, including at least one light-emitting polymer connected to said second substrate, and a third substrate, where both said first stack of materials and said second stack of materials emit light, and light emitted by said second stack of materials passes through said first stack of materials to be emitted from a surface having said transparent conductive substrate.

22. The device as in claim 21, wherein said light-emitting polymer layers emit light of a wavelength that is dependent on a frequency of said electrical connection.

23. The device as in claim 22, further comprising a first signal generator, to output a signal having a frequency to said electrical connection to drive said first stack of materials, and a second signal generator producing an output that drives said second stack of materials.

24. The device as in claim 21, where said third substrate is reflective.

25. The device as in claim 21, wherein said light emitting substance is attached to said housing over a curved surface of said housing.

* * * * *